(12) United States Patent
Pu et al.

(10) Patent No.: US 12,713,796 B2
(45) Date of Patent: Aug. 18, 2026

(54) DISPLAY PANEL IMPROVING ELECTRICAL RELIABILITY AND RELIABILTY LEVEL AND DRIVE SUBSTRATE THEREOF

(71) Applicants: Yunnan Invensight Optoelectronics Technology Co., Ltd., Kunming (CN); BOE Technology Group Co., Ltd., Beijing (CN)

(72) Inventors: Chao Pu, Beijing (CN); Shengji Yang, Beijing (CN); Junyan Yang, Beijing (CN); Xiaochuan Chen, Beijing (CN); Kuanta Huang, Beijing (CN); Pengcheng Lu, Beijing (CN); Bin Wu, Beijing (CN); Shengdi Zhu, Beijing (CN); Yanqiang Ding, Beijing (CN); Zhicheng Guo, Beijing (CN); Yun Zhu, Beijing (CN)

(73) Assignees: Yunnan Invensight Optoelectronics Technology Co., Ltd., Kunming (CN); BOE Technology Group Co., Ltd., Beijing (CN)

( * ) Notice: Subject to any disclaimer, the term of this patent is extended or adjusted under 35 U.S.C. 154(b) by 435 days.

(21) Appl. No.: 18/548,341

(22) PCT Filed: Nov. 15, 2022

(86) PCT No.: PCT/CN2022/132050

§ 371 (c)(1), (2) Date: Aug. 30, 2023

(87) PCT Pub. No.: WO2024/103260

PCT Pub. Date: May 23, 2024

(65) Prior Publication Data

US 2025/0031536 A1 Jan. 23, 2025

(51) Int. Cl.
*H10K 59/131* (2023.01)
*H10K 59/122* (2023.01)
*H10K 59/80* (2023.01)

(52) U.S. Cl.
CPC ......... *H10K 59/131* (2023.02); *H10K 59/122* (2023.02); *H10K 59/873* (2023.02); *H10K 59/876* (2023.02)

(58) Field of Classification Search
CPC .. H10K 59/131; H10K 59/122; H10K 59/873; H10K 59/876
See application file for complete search history.

(56) References Cited

U.S. PATENT DOCUMENTS

2019/0312229 A1 10/2019 Kim
2020/0210006 A1 7/2020 Son et al.
(Continued)

FOREIGN PATENT DOCUMENTS

CN 206650079 U 11/2017
CN 111081736 A 4/2020
(Continued)

OTHER PUBLICATIONS

Zhang et al., WO 2021195973 A1, machine translation and foreign translation, Oct. 2021 (Year: 2021).*
WO-2020248257-A1 (Year: 2020).*

*Primary Examiner* — Tracie Y Green
(74) *Attorney, Agent, or Firm* — WHDA, LLP

(57) ABSTRACT

A display panel and a driving baseplate, relate to the technical field of displaying. The display panel includes an active area and a peripheral area located on at least one side of the active area, and the display panel includes: a driving baseplate, including a substrate and a conducting ring embedded on a surface of one side of the substrate, wherein the conducting ring is located in the peripheral area; a light emitting device, located in the active area and disposed on (Continued)

a side of the driving baseplate close to the conducting ring; an isolation dam, located in the peripheral area and disposed on a side of the conducting ring away from the substrate, wherein the isolation dam overlaps with the conducting ring; and an encapsulation layer, disposed on sides of the light emitting device and the isolation dam away from the substrate.

19 Claims, 6 Drawing Sheets

(56) References Cited

U.S. PATENT DOCUMENTS

| | | | |
|---|---|---|---|
| 2020/0212147 | A1 | 7/2020 | Han et al. |
| 2020/0321292 | A1 | 10/2020 | Park et al. |
| 2021/0305535 | A1 | 9/2021 | Zhang et al. |
| 2022/0278300 | A1 | 9/2022 | Zhang et al. |

FOREIGN PATENT DOCUMENTS

| | | | | |
|---|---|---|---|---|
| CN | 111146211 | A | 5/2020 | |
| CN | 111509021 | A | 8/2020 | |
| CN | 111799302 | A | 10/2020 | |
| CN | 114023906 | A | 2/2022 | |
| CN | 114784016 | A | 7/2022 | |
| CN | 217768378 | U | 11/2022 | |
| KR | 20190031042 | A | 3/2019 | |
| KR | 20190070424 | A | 6/2019 | |
| KR | 20190117860 | A | 10/2019 | |
| WO | WO-2020248257 | A1 * | 12/2020 | ........... H10K 59/873 |
| WO | 2021/195973 | A1 | 10/2021 | |

* cited by examiner

DISPLAY PANEL IMPROVING ELECTRICAL RELIABILITY AND RELIABILTY LEVEL AND DRIVE SUBSTRATE THEREOF

TECHNICAL FIELD

The present disclosure relates to the technical field of displaying and more particularly, to a display panel and a driving baseplate.

BACKGROUND

An electroluminescent organic light emitting diode display has become a mainstream development trend of current displays due to its advantages of self-illumination, low power consumption, wide viewing angle, fast response speed and high contrast.

SUMMARY

The present disclosure provides a display panel, including an active area and a peripheral area located on at least one side of the active area, wherein the display panel further includes:

- a driving baseplate, including a substrate and a conducting ring embedded on a surface of one side of the substrate, wherein the conducting ring is located in the peripheral area;
- a light emitting device, located in the active area and disposed on a side of the driving baseplate close to the conducting ring;
- an isolation dam, located in the peripheral area and disposed on a side of the conducting ring away from the substrate, wherein the isolation dam overlaps with the conducting ring; and
- an encapsulation layer, disposed on sides of the light emitting device and the isolation dam away from the substrate.

In some embodiments, an orthographic projection of the isolation dam on the substrate covers an orthographic projection of the conducting ring on the substrate.

In some embodiments, an outer edge of an orthographic projection of the isolation dam on the substrate is located on a side of an outer edge of an orthographic projection of the conducting ring on the substrate away from the active area; and

- an inner edge of the orthographic projection of the isolation dam on the substrate is located on a side of an inner edge of the orthographic projection of the conducting ring on the substrate close to the active area.

In some embodiments, an outer edge of an orthographic projection of the isolation dam on the substrate is retracted by a preset distance relative to an outer edge of the substrate towards a side close to the active area, and the preset distance is greater than 0.

In some embodiments, the preset distance is greater than or equal to 20 microns, and less than or equal to 100 microns.

In some embodiments, in a first direction, a size of the isolation dam is greater than or equal to 0.1 times a size of the peripheral area, and less than or equal to 0.2 times the size of the peripheral area, and the first direction is a direction in which the peripheral area is away from the active area.

In some embodiments, the isolation dam is a closed circular structure surrounding the active area.

In some embodiments, edges of an orthographic projection of the isolation dam on the substrate are provided with at least one first interior angle, and edges of an orthographic projection of the conducting ring on the substrate are provided with at least one second interior angle;

- wherein the first interior angle and the second interior angle are both round corners.

In some embodiments, the isolation dam includes:

- a first isolation layer, wherein the first isolation layer is a continuous integrated structure in the first direction, and the first direction is a direction in which the peripheral area is away from the active area.

In some embodiments, the isolation dam further includes:

- a second isolation layer, located on a side of the first isolation layer close to the substrate, wherein the second isolation layer and the conducting ring are embedded on a same surface of the substrate, and an orthographic projection of the first isolation layer on the substrate covers an orthographic projection of the second isolation layer on the substrate.

In some embodiments, the second isolation layer includes a plurality of first isolation portions, and the plurality of first isolation portions are disposed at intervals along the first direction.

In some embodiments, an outer edge of the orthographic projection of the first isolation layer on the substrate is roughly flush with an outer edge of the orthographic projection of the second isolation layer on the substrate, and an inner edge of the orthographic projection of the first isolation layer on the substrate is roughly flush with an inner edge of the orthographic projection of the second isolation layer on the substrate.

In some embodiments, a thickness of the second isolation layer is equal to a thickness of the conducting ring.

In some embodiments, the isolation dam further includes:

- a third isolation layer, located on a side of the first isolation layer away from the substrate, an orthographic projection of the first isolation layer on the substrate covers an orthographic projection of the third isolation layer on the substrate.

In some embodiments, the third isolation layer includes a plurality of second isolation portions, and the plurality of second isolation portions are disposed at intervals along the first direction.

In some embodiments, the orthographic projection of the third isolation layer on the substrate does not overlap with an orthographic projection of a second isolation layer on the substrate when the isolation dam further includes the second isolation layer, the second isolation layer is located on a side of the first isolation layer close to the substrate, the second isolation layer and the conducting ring are embedded on a same surface of the substrate, and an orthographic projection of the first isolation layer on the substrate covers the orthographic projection of the second isolation layer on the substrate.

In some embodiments, in a direction away from the conducting ring, sizes of the second isolation portions gradually decrease along the first direction.

In some embodiments, the light emitting device includes: a reflecting electrode, a microcavity regulating layer, a first electrode, a luminescent layer and a second electrode that are disposed in stacked, and the reflecting electrode is disposed close to the driving baseplate:

- the display panel further includes: a pixel definition layer, disposed on a side of the driving baseplate close to the conducting ring and provided with a plurality of pixel openings which are used to set the light emitting device; and the isolation dam includes at least one isolation layer disposed in stacked, and the isolation layer and the microcavity regulating layer or the pixel definition layer are disposed in a same layer and made of same materials.

In some embodiments, the isolation dam includes a plurality of isolation layers that are disposed in stacked, and host materials of the plurality of isolation layers are the same.

In some embodiments, the display panel further includes:

a plurality of encapsulation dams, disposed between the substrate and the encapsulation layer, wherein the plurality of encapsulation dams are located between the isolation dam and the active area, the plurality of encapsulation dams are disposed at intervals along a first direction, and the first direction is a direction in which the peripheral area is away from the active area.

In some embodiments, in the first direction, a size of the isolation dam is greater than or equal to five times a size of each encapsulation dam.

In some embodiments, the substrate is a silicon substrate, and the driving baseplate further includes:

a drive circuit, located in the active area and at least partially embedded inside the silicon substrate, wherein the drive circuit overlaps with the light emitting device through a via hole and is used to drive the light emitting device to emit light.

The present disclosure provides a driving baseplate, applied to a display panel, the display panel includes a light emitting device, the driving baseplate includes a drive area and a functional area located on at least one side of the drive area, and the driving baseplate further includes:

a silicon substrate;

a drive circuit, located in the drive area and at least partially embedded inside the silicon substrate, wherein the drive circuit is used to drive the light emitting device to emit light;

a conducting ring, located in the functional area and embedded on a first surface of the silicon substrate; and an isolation layer, located in the functional area and embedded on the first surface of the silicon substrate.

In some embodiments, the isolation layer includes a plurality of isolation portions, the plurality of isolation portions are disposed at intervals along a second direction, and the second direction is a direction in which the functional area away from the drive area.

In some embodiments, the conducting ring is located between two adjacent isolation portions.

In some embodiments, the conducting ring is a closed circular structure surrounding the drive area.

The above description is merely a summary of the technical solutions of the present disclosure. In order to more clearly know the technological means of the present disclosure to enable the implementation according to the contents of the specification, and in order to make the above and other purposes, features and advantages of the present disclosure more apparent and understandable, the particular embodiments of the present disclosure are provided below.

BRIEF DESCRIPTION OF THE DRAWINGS

In order to more clearly illustrate the technical solutions of the embodiments of the present disclosure or the related art, the figures that are required to describe the embodiments or the related art will be briefly described below. Apparently, the figures that are described below are embodiments of the present disclosure, and a person skilled in the art can obtain other figures according to these figures without paying creative work. It should be noted that the proportions in the figures are only indicative and do not represent the actual proportions.

DETAILED DESCRIPTION

In order to make the purpose, technical solutions, and advantages of the embodiments of the present disclosure clearer, the following will provide a clear and complete description of the technical solutions in the embodiments of the present disclosure in conjunction with the accompanying drawings. Apparently, the described embodiments are merely certain embodiments of the present disclosure, rather than all of the embodiments. All of the other embodiments that a person skilled in the art obtains on the basis of the embodiments of the present disclosure without paying creative work fall within the protection scope of the present disclosure.

Figure 1:
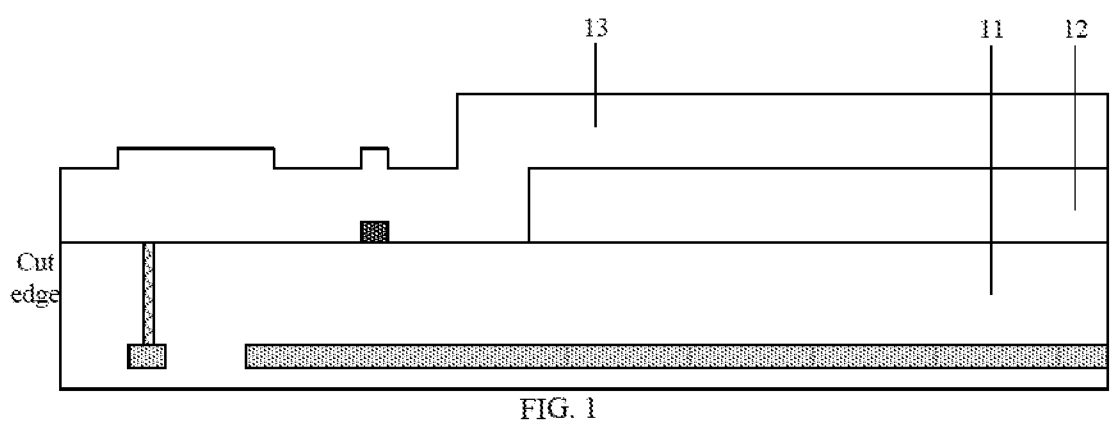
FIG. 1 schematically illustrates a schematic diagram of a section structure of a display panel in related art.

In related art, after completing a manufacturing and packaging process of a light emitting device on a wafer, a silicon-based display panel may be obtained by cutting the wafer. As shown in FIG. 1, the silicon-based display panel includes a silicon substrate 11, a light emitting device 12 disposed on the silicon substrate 11, and an encapsulation layer 13 covering the silicon substrate 11 and the light emitting device 12. During a cutting process, the silicon substrate 11 and the encapsulation layer 13 may produce cracks at a cut edge. In subsequent processes or usage, these cracks may extend inward, which may damage the electrical performance of the light emitting device 12 and affect the reliability of the display panel.

Figure 2:
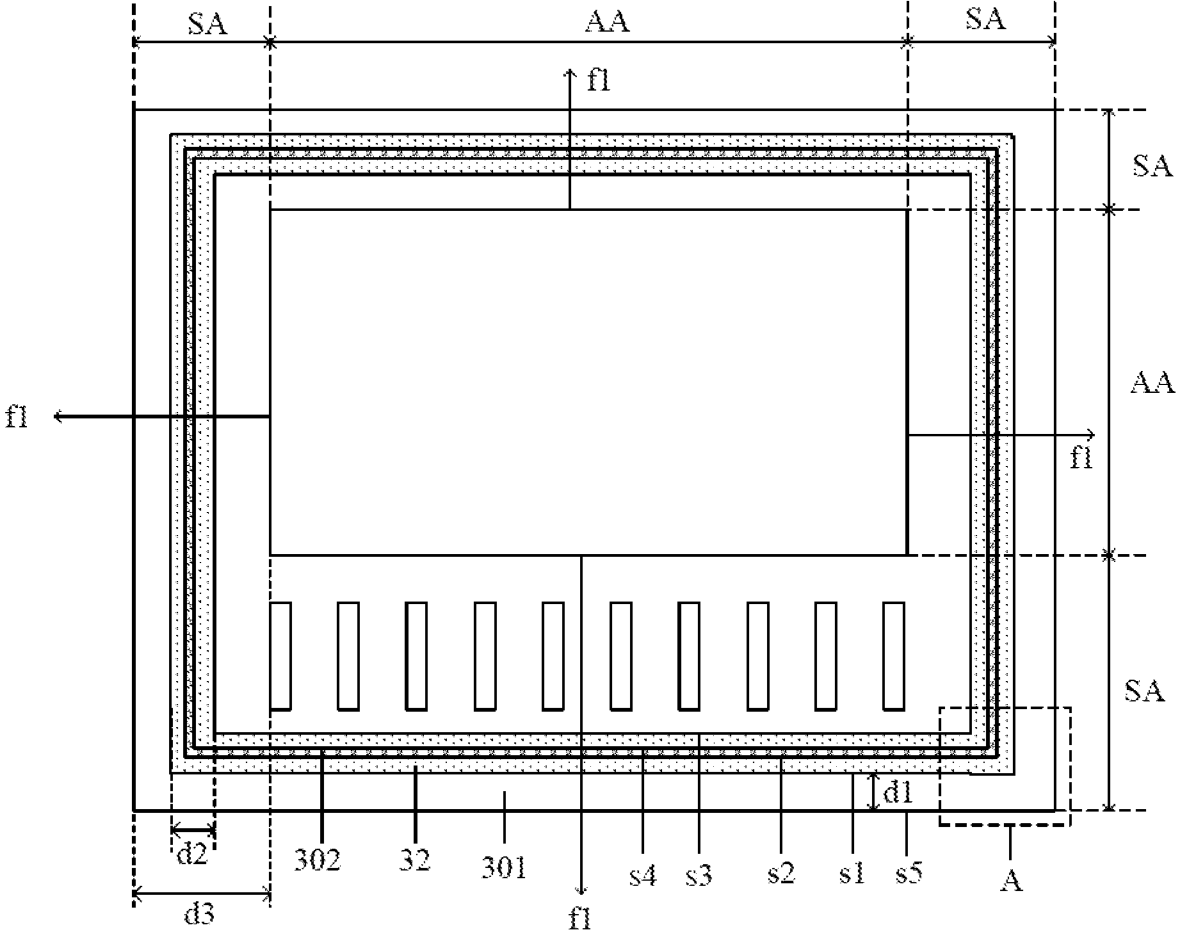
FIG. 2 schematically illustrates a schematic diagram of a plane structure of a display panel according to an embodiment of the present disclosure.

In order to solve the above problems, the present disclosure provides a display panel, as shown in FIG. 2, the display panel includes an active area AA and a peripheral area SA located on at least one side of the active area AA. Among them, the peripheral area SA may be located on one side or two sides of the active area AA or surround the active area AA (as shown in FIG. 2).

As shown in any one of FIG. 3 to FIG. 6, the display panel includes: a driving baseplate 30, including a substrate 301 and a conducting ring 302 embedded on a surface of one side of the substrate 301, wherein the conducting ring 302 is located in the peripheral area SA: a light emitting device 31, located in the active area AA and disposed on a side of the driving baseplate 30 close to the conducting ring 302: an isolation dam 32, located in the peripheral area SA and disposed on a side of the conducting ring 302 away from the substrate 301, wherein the isolation dam 32 overlaps with the conducting ring 302; and an encapsulation layer 33, disposed on sides of the light emitting device 31 and the isolation dam 32 away from the substrate 301.

The display panel provided by the embodiment of the present disclosure, by setting the isolation dam 32 between the substrate 301 and the encapsulation layer 33, and setting the isolation dam 32 located in the peripheral area SA between a cut edge (i.e., an edge of a side of the peripheral area SA away from the active area AA) and the active area AA, may make the isolation dam 32 to block the cracks generated at the cut edges of the encapsulation layer 33 and the substrate 301 from extending towards the active area AA, and greatly improve the electrical reliability and reliability level of the display panel. In addition, by setting the isolation dam 32 and the conducting ring 302 to overlap each other, it may be ensured that the cracks cannot extend into the active area AA through a gap between the isolation dam 32 and the conducting ring 302, thereby further improving the electrical reliability and reliability level of the display panel.

In some embodiments, the substrate 301 is a silicon substrate. As shown in any one of FIG. 3 to FIG. 6, the driving baseplate 30 further includes: a drive circuit 303, located in the active area AA and at least partially embedded inside the silicon substrate, wherein the drive circuit 303 overlaps with the light emitting device 31 through a via hole VIA and is used to drive the light emitting device 31 to emit light.

Specifically, as shown in any one of FIG. 3 to FIG. 6, the drive circuit 303 may include a conducting layer 34. In the active area AA, the conducting layer 34 is connected to the light emitting device 31 (a first electrode 313 as shown in the figure) through the via hole VIA. In the peripheral area SA, the conducting layer 34 overlaps with the conducting ring 302.

Among them, the silicon substrate may be a low-temperature polycrystalline silicon substrate, which is not limited in the present disclosure.

In specific implementation, a complementary metal oxide semiconductor (CMOS) process can be used to prepare the drive circuit 303 on the low-temperature polycrystalline silicon substrate, which is conducive to achieving the display panels with small volume and high resolution and can be applied in near-to-eye display devices such as virtual reality and augmented reality.

Among them, the conducting ring 302 may include conductive materials such as metals to release static electricity, while also preventing the edge cracks of the substrate 301 from extending towards the active area AA.

In some embodiments, the light emitting device 31 may be, for example, an Organic Light-Emitting Diode (OLED), a Quantum Dot Light-Emitting Diode (QLED), a Mini Light-Emitting Diode (Mini LED), or a Micro Light-Emitting Diode (Micro LED), and so on, which is not limited by the present disclosure.

In some embodiments, as shown in any one of FIG. 2 to FIG. 6, an orthographic projection of the isolation dam 32 on the substrate 301 covers an orthographic projection of the conducting ring 302 on the substrate 301. That is, the isolation dam 32 completely covers the conducting ring 302.

In some embodiments, as shown in FIG. 2, an outer edge s1 of the orthographic projection of the isolation dam 32 on the substrate 301 is located on a side of an outer edge s2 of the orthographic projection of the conducting ring 302 on the substrate 301 away from the active area AA; and an inner edge s3 of the orthographic projection of the isolation dam 32 on the substrate 301 is located on a side of an inner edge s4 of the orthographic projection of the conducting ring 302 on the substrate 301 close to the active area AA.

It should be noted that, "the outer edge of the orthographic projection" in the specification refers to an edge of a side of the orthographic projection area away from the active area AA, and "the inner edge of the orthographic projection" refers to an edge of a side of the orthographic projection area close to the active area AA.

As shown in FIG. 2, by setting the outer edge s1 of the orthographic projection of the isolation dam 32 on an outside (that is, the side away from the active area AA) of the outer edge s2 of the orthographic projection of the conducting ring 302, and setting the inner edge s3 of the orthographic projection of the isolation dam 32 on an inside (that is, the side close to the active area AA) of the inner edge s4 of the orthographic projection of the conducting ring 302, it can ensure that the isolation dam 32 completely covers the conducting ring 302, thereby fully blocking the edge cracks of the substrate 301 from extending to the encapsulation layer 33, and preventing the edge cracks of the encapsulation layer 33 from extending to the substrate 301.

In some embodiments, as shown in FIG. 2, the outer edge s1 of the orthographic projection of the isolation dam 32 on the substrate 301 is retracted by a preset distance d1 relative to an outer edge s5 of the substrate 301 towards a side close to the active area AA, and the preset distance d1 is greater than 0).

In specific implementation, the preset distance d1 can be determined based on a half width of a cutting wheel and an alignment accuracy of a cutting process, which ensures that after the cutting process, an end surface of the side of the isolation dam 32 away from the active area AA is still covered by the encapsulation layer 33, and may prevent the isolation dam 32 from being exposed, which will affect the product encapsulation performance. In specific implementation, the preset distance d1 may be a sum of the half width of the cutting wheel and the alignment accuracy of the cutting process.

In some embodiments, as shown in FIG. 2, the preset distance is greater than or equal to 20 microns, and less than or equal to 100 microns. Furthermore, the preset distance may be greater than or equal to 50 microns, and less than or equal to 100 microns.

As shown in any one of FIG. 2 to FIG. 6, a first direction f1 is a direction in which the peripheral area SA is away from the active area AA.

In some embodiments, as shown in FIG. 2, in the first direction f1, a size d2 of the isolation dam 32 is greater than or equal to 0.1 times a size d3 of the peripheral area, and less than or equal to 0.2 times the size d3 of the peripheral area. Among them, the size d3 of the peripheral area is a size of the peripheral area SA in the first direction f1.

For example, the size d3 of the peripheral area is 1 mm, the size d2 of the isolation dam 32 may be greater than or equal to 100 microns, and less than or equal to 150 microns or 200 microns.

In specific implementation, as shown in FIG. 2, the conducting ring 302 may be a closed circular structure surrounding the active area AA.

In some embodiments, as shown in FIG. 2, the isolation dam 32 is a closed circular structure surrounding the active area AA. In this way, the isolation dam 32 may, at the periphery of the active area AA, comprehensively block the extension of the edge cracks to the active area AA.

Figure 7:
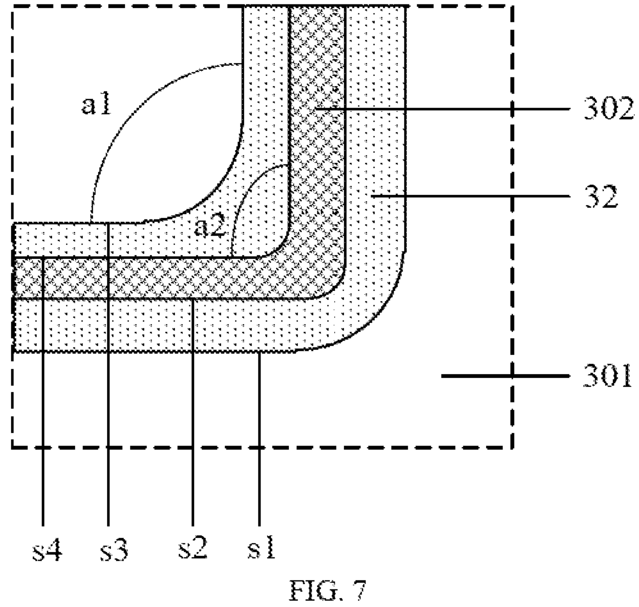
FIG. 7 schematically illustrates a schematic diagram of an enlarged structure of position A in FIG. 2.

Referring to FIG. 7, FIG. 7 schematically illustrates a schematic diagram of an enlarged structure of position A in FIG. 2.

In some embodiments, as shown in FIG. 7, edges of the orthographic projection of the isolation dam 32 on the substrate 301 are provided with at least one first interior angle a1, and edges of the orthographic projection of the conducting ring 302 on the substrate 301 are provided with at least one second interior angle a2: wherein the first interior angle a1 and the second interior angle a2 are both round corners.

Among them, the first interior angle 1 may be an interior angle of the outer edge s1 of the orthographic projection of the isolation dam 32 on the substrate 301, or an interior angle of the inner edge s3 of the orthographic projection of the isolation dam 32 on the substrate 301. The second interior angle2 may be an interior angle of the outer edge s2 of the orthographic projection of the conducting ring 302 on the substrate 301, or an interior angle of the inner edge s4 of the orthographic projection of the conducting ring 302 on the substrate 301.

By setting both the first interior angle 1 and the second interior angle 2 as round corners, it is possible to avoid stress concentration at sharp interior corners, and avoid weakening the crack blocking effect of the isolation dam 32 and the conducting ring 302, thereby improving packaging reliability.

In some embodiments, as shown in any one of FIG. 3 to FIG. 6, the isolation dam 32 includes: a first isolation layer 321, wherein the first isolation layer 321 is a continuous integrated structure in the first direction f1.

Figure 4:
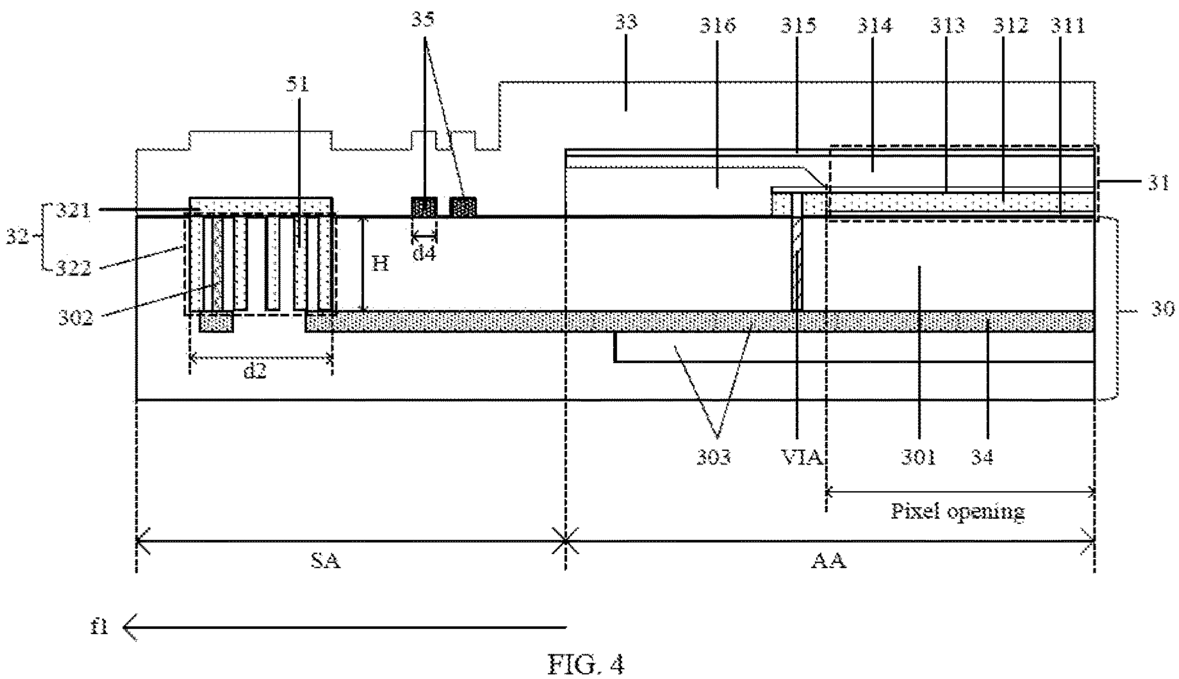
FIG. 4 schematically illustrates a schematic diagram of a section structure of a second display panel according to an embodiment of the present disclosure.
Figure 5:
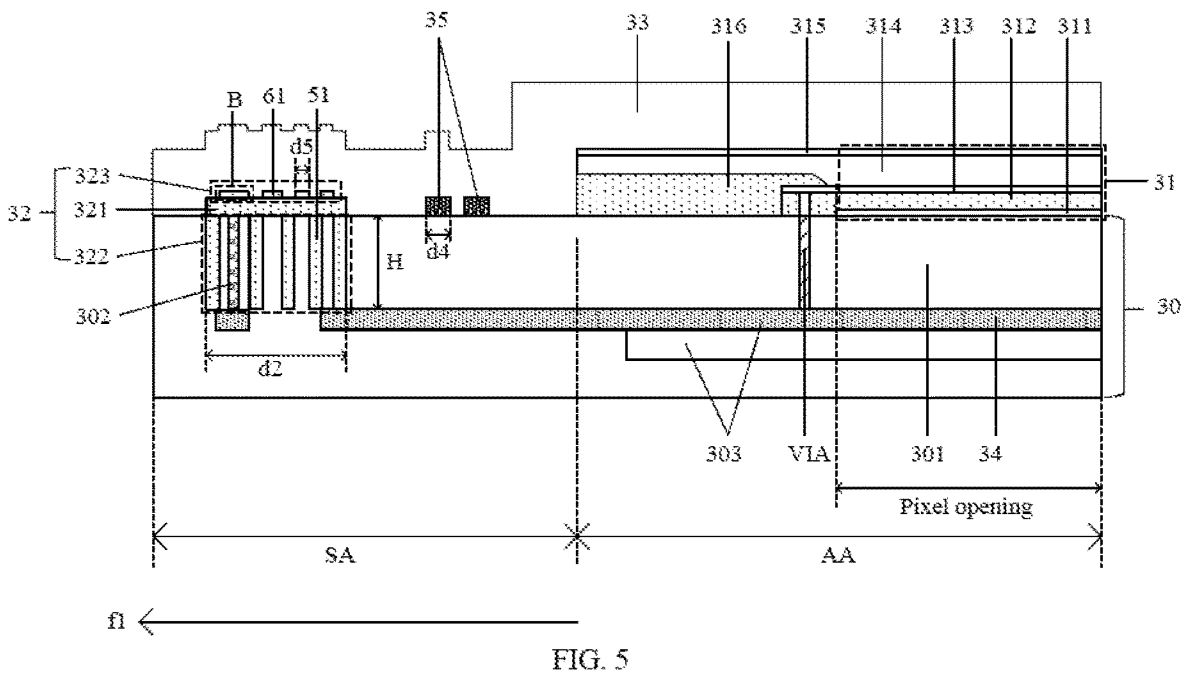
FIG. 5 schematically illustrates a schematic diagram of a section structure of a third display panel according to an embodiment of the present disclosure.

In some embodiments, as shown in FIG. 4 or FIG. 5, the isolation dam 32 further includes: a second isolation layer 322, located on a side of the first isolation layer 321 close to the substrate 301, wherein the second isolation layer 322 and the conducting ring 302 are embedded on a same surface of the substrate 301. As shown in FIG. 4 or FIG. 5, the first isolation layer 321 is located on sides of the second isolation layer 322 and the conducting ring 302 away from the substrate 301, and the first isolation layer 321 overlaps with the second isolation layer 322 and the conducting ring 302, respectively.

By stacking the first isolation layer 321 and the second isolation layer 322 to form the isolation dam 32, the ability of the isolation dam 32 to prevent cracks from extending from the cut edge to the active area AA can be further improved.

In some embodiments, as shown in FIG. 4 or FIG. 5, an orthographic projection of the first isolation layer 321 on the substrate 301 covers an orthographic projection of the second isolation layer 322 on the substrate 301. Correspondingly, an area of the orthographic projection of the first isolation layer 321 on the substrate 301 is greater than or equal to an area of the orthographic projection of the second isolation layer 322 on the substrate 301.

In some embodiments, as shown in FIG. 4 or FIG. 5, the second isolation layer 322 includes a plurality of first isolation portions 51, and the plurality of first isolation portions 51 are disposed at intervals along the first direction f1.

As shown in FIG. 4 or FIG. 5, in the first direction f1, the plurality of first isolation portions 51 are arranged in sequence with each other spaced apart, and the conducting ring 302 is located between two adjacent first isolation portions 51.

As shown in FIG. 4 or FIG. 5, the plurality of first isolation portions 51 disposed at intervals along the first direction f1 may form multi-level barriers against cracks from the cut edge of the substrate 301, thus enhancing the ability of the isolation dam 32 to prevent the cracks from extending from the cut edge of the substrate 301 to the active area AA.

In specific implementation, the second isolation layer 322 may include at least two first isolation portions 51. In FIG. 4 and FIG. 5, the second isolation layer 322 includes five first isolation portions 51.

In some embodiments, an outer edge (a left edge of the first isolation layer 321 shown in FIG. 4 or FIG. 5) of the orthographic projection of the first isolation layer 321 on the substrate 301 is roughly flush with an outer edge (a left edge of the second isolation layer 322 shown in FIG. 4 or FIG. 5) of the orthographic projection of the second isolation layer 322 on the substrate 301, and an inner edge (a right edge of the first isolation layer 321 shown in FIG. 4 or FIG. 5) of the orthographic projection of the first isolation layer 321 on the substrate 301 is roughly flush with an inner edge (a right edge of the second isolation layer 322 shown in FIG. 4 or FIG. 5) of the orthographic projection of the second isolation layer 322 on the substrate 301.

As shown in FIG. 4 or FIG. 5, when the second isolation layer 322 includes the plurality of first isolation portions 51, the outer edge of the orthographic projection of the second isolation layer 322 on the substrate 301 refers to an outer edge of an orthographic projection, on the substrate 301, of the first isolation portion 51 farthest from the active area AA in the plurality of first isolation portions 51; and the inner edge of the orthographic projection of the second isolation layer 322 on the substrate 301 refers to an inner edge of an orthographic projection, on the substrate 301, of the first isolation portion 51 closest to the active area AA in the plurality of first isolation portions 51.

By setting that edges of the orthographic projections of the first isolation layer 321 and the second isolation layer 322 on the substrate 301 are roughly flush, the first isolation layer 321 and the second isolation layer 322 can smoothly transition and have no steps on the end surfaces close to the active area AA and the end surfaces away from the active area AA, thereby making the overall isolation dam 32 more stable and the ability of blocking crack extension stronger.

In some embodiments, a thickness of the second isolation layer 322 is equal to a thickness of the conducting ring 302. As shown in FIG. 4 or FIG. 5, the thicknesses of the second isolation layer 322 and the conducting ring 302 are H. In this way, holes of the conducting ring 302 and the second isolation layer 322 may be formed synchronously through a single process, while simplifying the process flow, the stability of the second isolation layer 322 within the substrate 301 may also be improved.

In some embodiments, a thickness of the first isolation portion 51 may be the same as a thickness of the via hole VIA of the active area, as shown in FIG. 4 or FIG. 5, the thicknesses of the first isolation portion 51 and the via hole VIA are H. In this way, the first isolation portions 51 and the via hole VIA may be formed synchronously through a single process, thereby simplifying the process flow.

Figure 6:
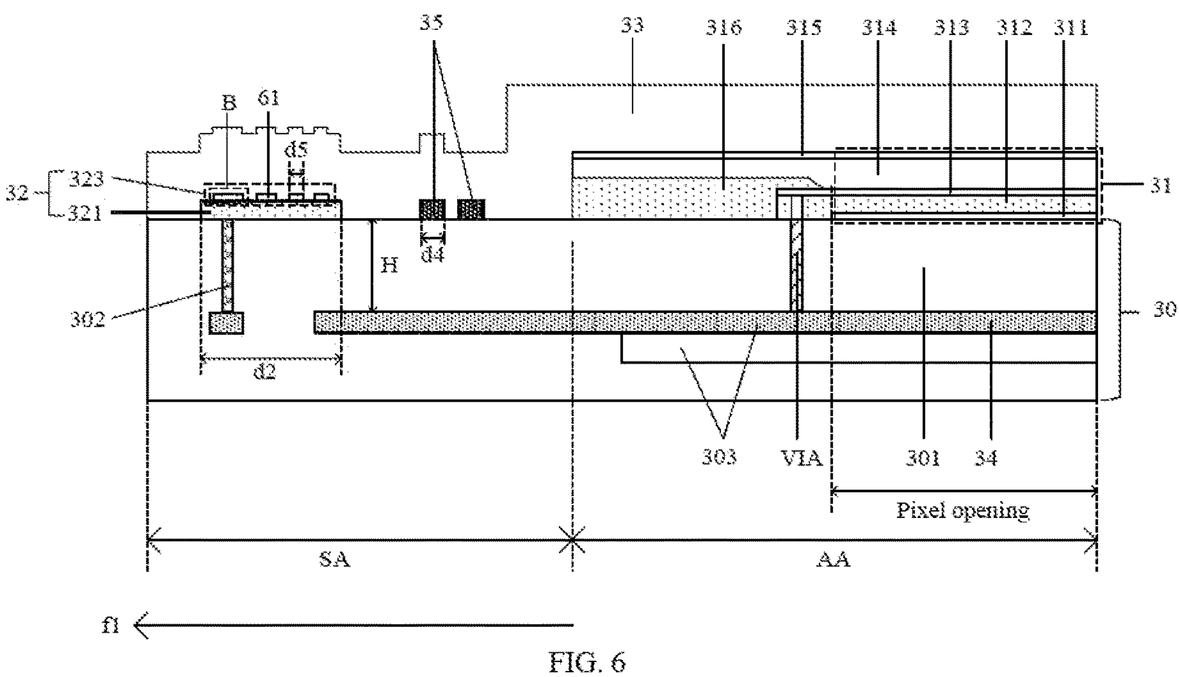
FIG. 6 schematically illustrates a schematic diagram of a section structure of a fourth display panel according to an embodiment of the present disclosure.

In some embodiments, as shown in FIG. 5 or FIG. 6, the isolation dam 32 further includes: a third isolation layer 323, located on a side of the first isolation layer 321 away from the substrate 301, an orthographic projection of the first isolation layer 321 on the substrate 301 covers an orthographic projection of the third isolation layer 323 on the substrate 301. Correspondingly, an area of the orthographic projection of the first isolation layer 321 on the substrate 301 is greater than or equal to an area of the orthographic projection of the third isolation layer 323 on the substrate 301.

In FIG. 6, the isolation dam 32 includes the first isolation layer 321 and the third isolation layer 323 that are disposed in stacked.

In FIG. 5, the isolation dam 32 includes the second isolation layer 322, the first isolation layer 321 and the third isolation layer 323 that are sequentially stacked. The three isolation layers disposed in stacked may further enhance the ability of the isolation dam 32 to prevent the cracks from extending from the cut edge to the active area AA.

In some embodiments, as shown in FIG. 5 or FIG. 6, the third isolation layer 323 includes a plurality of second isolation portions 61, and the plurality of second isolation portions 61 are disposed at intervals along the first direction f1. As shown in FIG. 5 or FIG. 6, in the first direction f1, the plurality of second isolation portions 61 are arranged in sequence with each other spaced apart.

As shown in FIG. 5 or FIG. 6, the plurality of second isolation portions 61 disposed at intervals along the first direction f1 may form the multi-level barriers against the cracks from the cut edge of the encapsulation layer 33, thus enhancing the ability of the isolation dam 32 to prevent the cracks from extending from the cut edge of the encapsulation layer 33 to the active area AA.

In specific implementation, the third isolation layer 323 may include at least two second isolation portions 61. In FIG. 5 and FIG. 6, the third isolation layer 323 includes four second isolation portions 61.

In some embodiments, as shown in FIG. 5, the isolation dam 32 includes the second isolation layer 322, the first isolation layer 321 and the third isolation layer 323 that are sequentially stacked. In this case, the orthographic projection of the third isolation layer 323 on the substrate 301 does not overlap with the orthographic projection of the second isolation layer 322 on the substrate 301.

As shown in FIG. 5, the second isolation layer 322 includes the plurality of first isolation portions 51, and third isolation layer 323 includes the plurality of second isolation portions 61. In the first direction f1, the orthographic projections of the first isolation parts 51 on the substrate 301 is alternately arranged with the orthographic projections of the second isolation parts 61 on the substrate 301. In this way, the crack stress may be evenly distributed within the isolation dam 32, and the isolation dam 32 may evenly buffer the crack stress.

In specific implementation, the outer edge of the orthographic projection of the first isolation layer 321 on the substrate 301 may be flush (as shown in FIG. 6) or not flush (as shown in FIG. 5) with an outer edge of the orthographic projection of the third isolation layer 323 on the substrate 301, and the inner edge of the orthographic projection of the first isolation layer 321 on the substrate 301 may be flush (as shown in FIG. 6) or not flush (as shown in FIG. 5) with an inner edge of the orthographic projection of the third isolation layer 323 on the substrate 301.

As shown in FIG. 4 or FIG. 5, when the third isolation layer 323 includes the plurality of second isolation portions 61, the outer edge of the orthographic projection of the third isolation layer 323 on the substrate 301 refers to an outer edge of an orthographic projection, on the substrate 301, of the second isolation portion 61 farthest from the active area AA in the plurality of second isolation portions 61; and the inner edge of the orthographic projection of the third isolation layer 323 on the substrate 301 refers to an inner edge of an orthographic projection, on the substrate 301, of the second isolation portion 61 closest to the active area AA in the plurality of second isolation portions 61.

In some embodiments, in a direction away from the conducting ring 302, a size d5 of the second isolation portion 61 gradually decreases along the first direction f1. As shown in FIG. 5 or FIG. 6, with a distance between the second isolation portion 61 and the conducting ring 302 increases, the size d5 of the second isolation portion 61 gradually decreases. That is, the size d5 of the second isolation portion 61, which is closer to the conducting ring 302, is larger, while the size d5 of the second isolation portion 61, which is farther away from the conducting ring 302, is smaller.

In FIG. 5 or FIG. 6, the size of the second isolation portion 61 that overlaps with the orthographic projection of the conducting ring 302 on the substrate 301 is the largest.

Because the conducting ring 302 may block the edge cracks from extending towards the active area AA, the stress of the cracks at a position closer to the conducting ring 302 is relatively large. By setting the second isolation portion 61 with a larger size closer to the conducting ring 302, the stress of the cracks can be effectively released, thereby improving the ability of the third isolation layer 323 to block the extension of the cracks.

Figure 8:
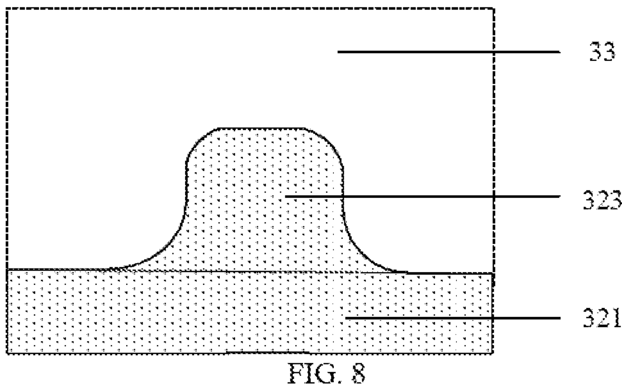
FIG. 8 schematically illustrates a schematic diagram of an enlarged structure of position B in FIG. 5 or FIG. 6.

Referring to FIG. 8, FIG. 8 schematically illustrates a schematic diagram of an enlarged structure of position B in FIG. 5 or FIG. 6. As shown in FIG. 8, a shape of the longitudinal section (the section perpendicular to the substrate 301) of the second isolation portion 61 is a trapezoid, and the interior angles of the trapezoid are round corners.

It should be noted that, the second isolation layer 322 may also be a continuous integrated structure in the first direction f1, and the third isolation layer 323 may also be a continuous integrated structure in the first direction f1.

It should be noted that, the surface of the side of the isolation dam 32 away from the substrate 301 is covered by the encapsulation layer 33, to avoid reducing the reliability of the display panel due to the exposure of the isolation dam 32.

In some embodiments, as shown in any one of FIG. 3 to FIG. 6, the light emitting device 31 includes: a reflecting electrode 311, a microcavity regulating layer 312, a first electrode 313, a luminescent layer 314 and a second electrode 315 that are disposed in stacked, and the reflecting electrode 311 is disposed close to the driving baseplate 30.

As shown in any one of FIG. 3 to FIG. 6, the display panel may further include: a pixel definition layer 316, disposed on a side of the driving baseplate 30 close to the conducting ring 302 and provided with a plurality of pixel openings which are used to set the light emitting device 31.

Among them, the microcavity regulating layer 312 is used to adjust the color purity and intensity of the light emitted by the light emitting device 31. The material of the microcavity regulating layer 312 may include at least one of the following inorganic materials: silicon nitride, silicon oxide, and silicon oxynitride. The pixel definition layer 316 is used to separate two adjacent light emitting devices 31, and the material of the pixel definition layer 316 may include at least one of the following inorganic materials: silicon nitride, silicon oxide, and silicon oxynitride.

As shown in any one of FIG. 3 to FIG. 6, the isolation dam 32 includes at least one isolation layer, and the isolation layer and the microcavity regulating layer 312 or the pixel definition layer 316 are disposed in a same layer and made of same materials. In this way, the isolation layer and the microcavity regulating layer 312 or the pixel definition layer 316 may be formed synchronously.

Figure 3:
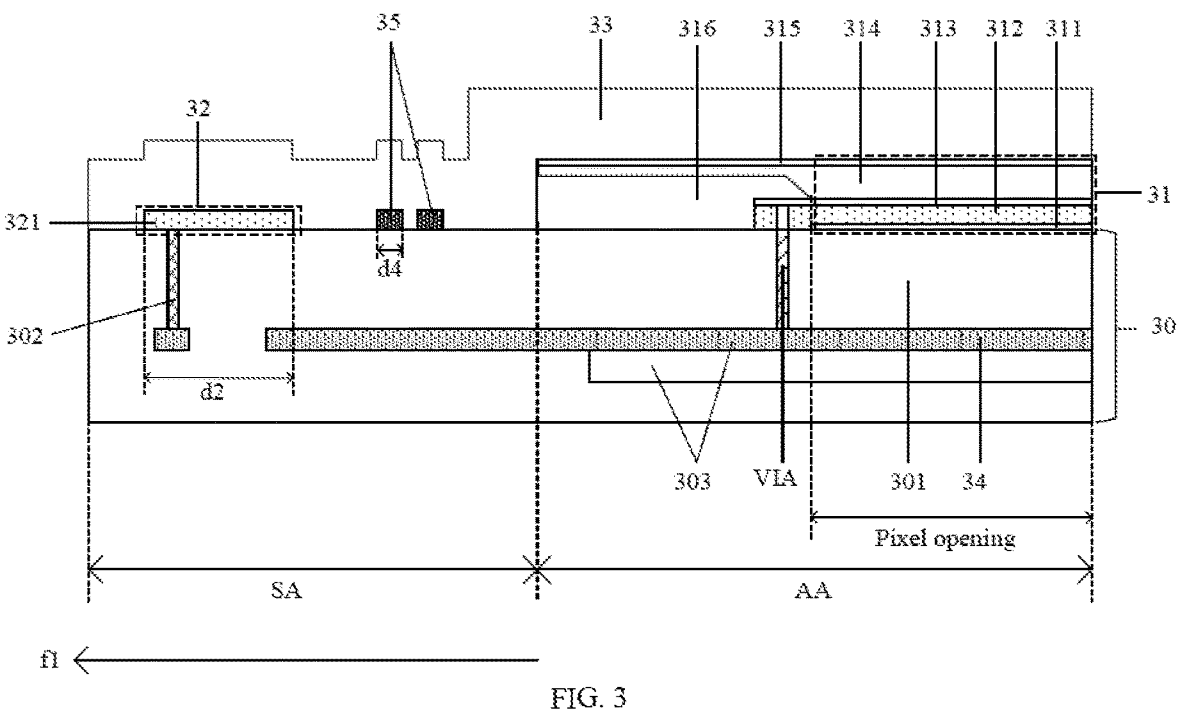
FIG. 3 schematically illustrates a schematic diagram of a section structure of a first display panel according to an embodiment of the present disclosure.

For example, in FIG. 3, the isolation dam 32 includes one isolation layer, that is, the first isolation layer 321, the first isolation layer 321 may be formed synchronously with the microcavity regulating layer 312 (as shown in FIG. 3), and may also be formed synchronously with the pixel definition layer 316.

For example, in FIG. 4, the isolation dam 32 includes two isolation layers, that is, the second isolation layer 322 and the first isolation layer 321 that are stacked. Among them, the first isolation layer 321 may be formed synchronously with the microcavity regulating layer 312 (as shown in FIG. 4), and may also be formed synchronously with the pixel definition layer 316.

For example, in FIG. 5, the isolation dam 32 includes three isolation layers, that is, the second isolation layer 322, the first isolation layer 321 and the third isolation layer 323 that are stacked. Among them, the first isolation layer 321 may be formed synchronously with the microcavity regulating layer 312, and the third isolation layer 323 may be formed synchronously with the pixel definition layer 316.

For example, in FIG. 6, the isolation dam 32 includes two isolation layers, that is, the first isolation layer 321 and the third isolation layer 323 that are stacked. Among them, the first isolation layer 321 may be formed synchronously with the microcavity regulating layer 312, and the third isolation layer 323 may be formed synchronously with the pixel definition layer 316.

In some embodiments, the isolation dam 32 includes a plurality of isolation layers that are disposed in stacked, and host materials of the plurality of isolation layers are the same. In this way, the stress at the interface of different isolation layers can be reduced, and the cracks caused by the stress at the interface can be avoided from extending inside the active area AA.

For example, when the isolation dam 32 includes the second isolation layer 322, the first isolation layer 321 and the third isolation layer 323 that are stacked, the host materials of the first isolation layer 321, the second isolation layer 322 and the third isolation layer 323 may all be inorganic materials such as silicon oxide, silicon nitride, or silicon oxynitride.

The inventor compares the three materials: silicon oxide, silicon nitride, and silicon oxynitride. In the experiment, it is found that when the host material of the plurality of isolation layers is silicon oxide, the stress at the interface of different isolation layers is the smallest.

In specific implementation, when the isolation dam 32 includes the second isolation layer 322, the first isolation layer 321 and the third isolation layer 323 that are stacked, interior angles of edges of the orthographic projection of any one of the first isolation layer 321, the second isolation layer 322 and the third isolation layer 323 on the substrate 301 may be round corners, which may avoid stress concentration at sharp interior corners, and avoid weakening the crack blocking effect of the isolation dam 32 and the conducting ring 302, thereby improving the packaging reliability.

In some embodiments, as shown in FIG. 3, the display panel further includes: a plurality of encapsulation dams 35, disposed between the substrate 301 and the encapsulation layer 33, wherein the plurality of encapsulation dams 35 are located between the isolation dam 32 and the active area AA, the plurality of encapsulation dams 35 are disposed at intervals along the first direction f1, and the first direction f1 is a direction in which the peripheral area SA is away from the active area AA.

By setting the plurality of encapsulation dams 35, a transmission path of water and oxygen from the cut edge to the active area AA can be extended, thus reducing the probability of water and oxygen eroding the light emitting device 31, and improving the packaging reliability.

In order to maximize the invasion path of water and oxygen in the limited peripheral area SA, in the first direction f1, the size d4 of the encapsulation dam 35 may be less than the size d2 of the isolation dam 32, so that a large number of the encapsulation dams 35 may be set up in the limited space. In some embodiments, in the first direction f1, the size d2 of the isolation dam 32 is greater than or equal to five times the size d4 of the encapsulation dam 35.

In specific implementation, the size d2 of the isolation dam 32 and the size d4 of the encapsulation dam 35 can be designed based on actual needs and the size of the peripheral area SA. For example, in the first direction f1, the size d2 of the isolation dam 32 may be about ten times the size d4 of the encapsulation dam 35.

It should be noted that in this specification, an orthographic projection of A is located in B, or an orthographic projection of B covers A, may refer to one of the following three situations: firstly, a whole boundary of the orthographic projection of A is located inside a boundary of the orthographic projection of B: secondly, a part of the boundary of the orthographic projection of A coincides with the boundary of the orthographic projection of B, while the remaining part is located inside the boundary of the orthographic projection of B; thirdly, the whole boundary of the orthographic projection of A coincides with the boundary of the orthographic projection of B.

In addition, the thickness in this specification refers to the size along the normal direction of the substrate 301.

Figure 9:
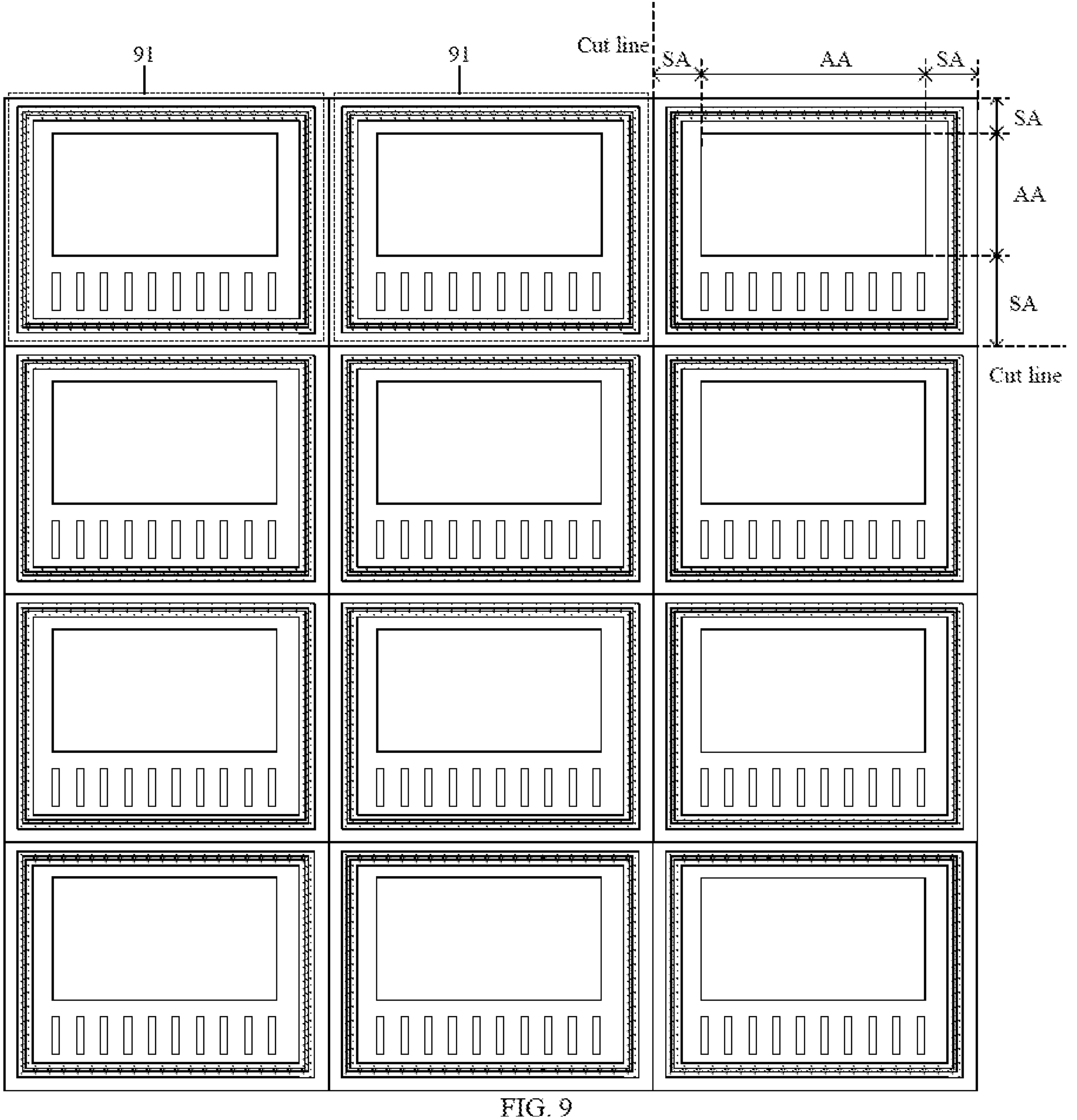
FIG. 9 schematically illustrates a schematic diagram of a plane structure of a display motherboard.

The present disclosure further provides a display motherboard, as shown in FIG. 9, the display motherboard includes a plurality of display panels 91 according to any one of the embodiments, and the display panels 91 may be obtained by cutting the display motherboard along the cut line.

A person skilled in the art may understand that the display motherboard has the advantages of the display panel 91 as described above.

The present disclosure further provides a display device, including: the display panel according to any one of the embodiments, an integrated circuit configured to provide driving signals to the display panel; and a power supply circuit configured to provide power to the display panel.

A person skilled in the art may understand that the display device has the advantages of the display panel as described above.

Among them, the display device is a product with an image display function. For example, the display device may be any one of: a monitor, a television, a billboard, a digital photo frame, a laser printer with the display function, a phone, a mobile phone, a Personal Digital Assistant (PDA), a digital camera, a portable camera, a viewfinder, a navigation device, a vehicle, a wall with a large area, a home appliance, an information query device (such as a business query device in departments such as e-government, banks, hospitals, power, etc.), a monitor, and the like. The display device may also be a micro display or a product including the micro display. The product including the micro display may be any one of a smartwatch, a smart wristband, a helmet display, a stereoscopic display, an AR device (such as an AR glass), a VR device (such as a VR glass), and the like. For example, the micro display may be a display with a display size range of approximately 0.2 inches to approximately 2.5 inches, but not limited to this. It can be understood that the micro display may also be a display with a smaller display size, such as the display size less than or equal to 0.2 inches.

Figure 10:
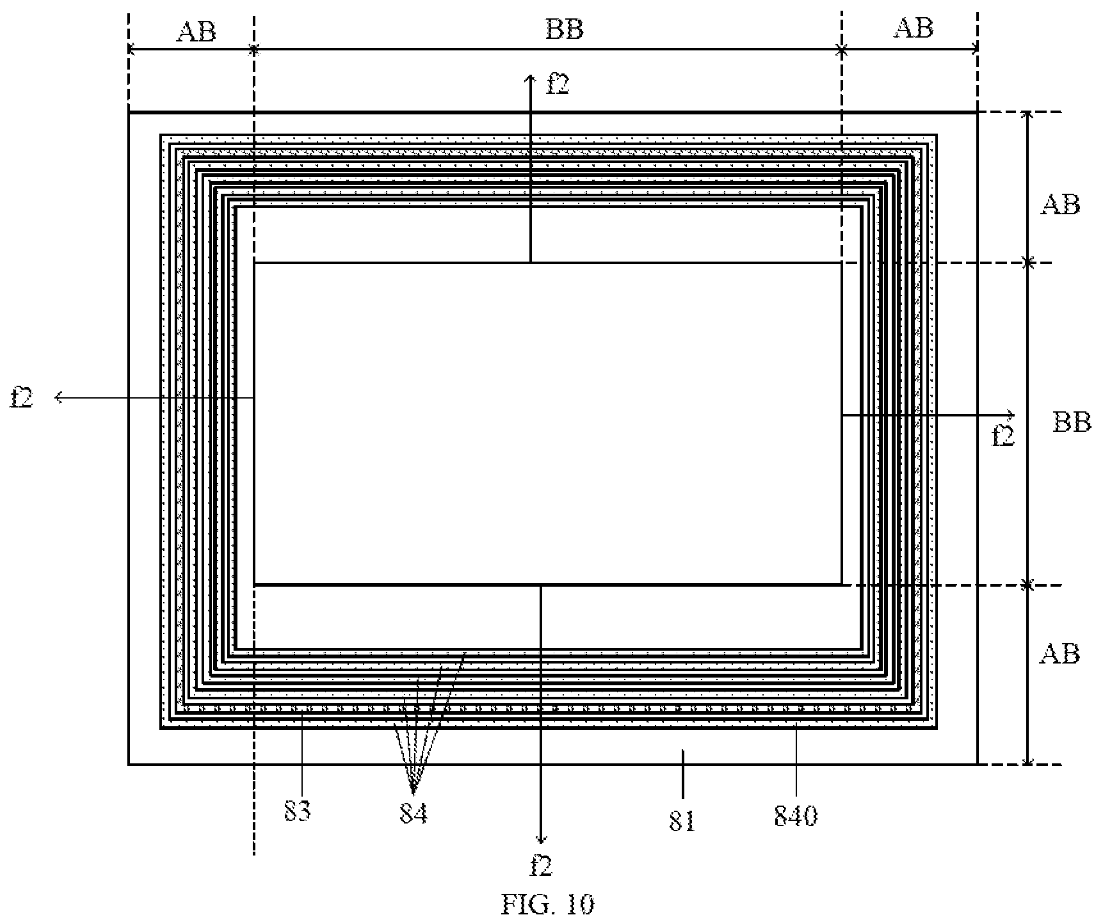
FIG. 10 schematically illustrates a schematic diagram of a plane structure of a driving baseplate according to an embodiment of the present disclosure.

The present disclosure further provides a driving baseplate, applied to a display panel, the display panel includes a light emitting device, as shown in FIG. 10, the driving baseplate includes a drive area BB and a functional area AB located on at least one side of the drive area BB. The functional area AB may be located on one side or two sides of the drive area BB, or surround the drive area BB (as shown in FIG. 10).

Figure 11:
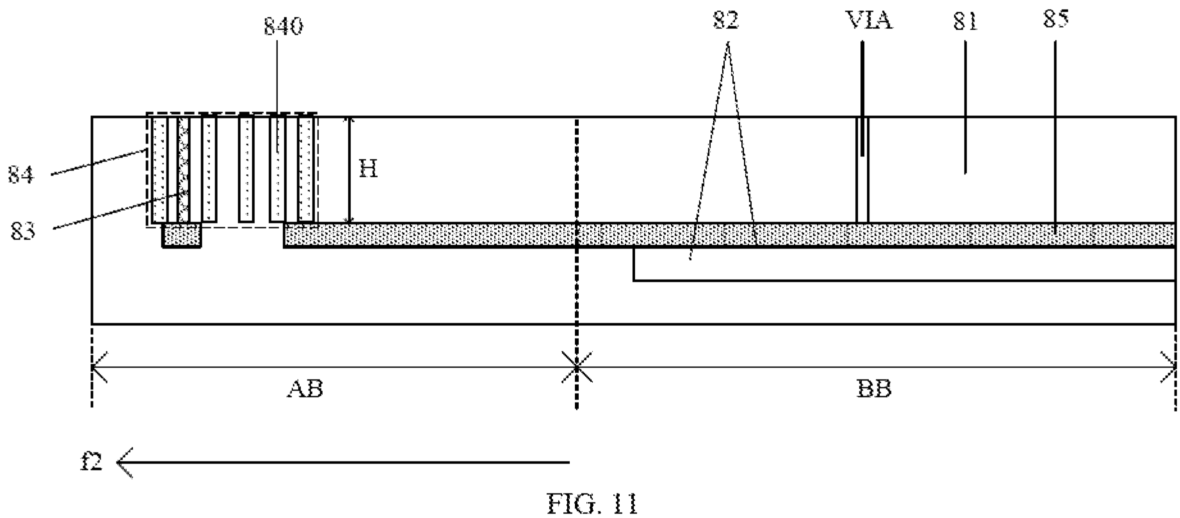
FIG. 11 schematically illustrates a schematic diagram of a section structure of a driving baseplate according to an embodiment of the present disclosure.

As shown in FIG. 11, the driving baseplate includes: a silicon substrate 81: a drive circuit 82, located in the drive area BB and at least partially embedded inside the silicon substrate 81, wherein the drive circuit 82 is used to drive the light emitting device to emit light: a conducting ring 83, located in the functional area AB and embedded on a first surface of the silicon substrate 81; and an isolation layer 84, located in the functional area AB and embedded on the first surface of the silicon substrate 81.

A person skilled in the art may understand that when the driving baseplate provided by the present disclosure is applied to the display panel, the driving baseplate has the advantages of the display panel provided by the above embodiments.

The driving baseplate provided in the present disclosure may be used as the driving baseplate 30 in the display panel provided in the aforementioned embodiments. In this case, the driving area BB of the driving baseplate is located in the active area AA of the display panel, and the functional area AB of the driving baseplate is located in the peripheral area SA of the display panel. The light emitting device is located on one side of the driving baseplate close to the first surface or the conducting ring 83. The isolation layer 84 embedded on the first surface of the silicon substrate 81 is equivalent to the second isolation layer 322 in the aforementioned embodiments. The isolation layer 84 and the second isolation layer 322 have the same or similar characteristics, which will not be repeated here.

In some embodiments, as shown in FIG. 10 or FIG. 11, the isolation layer 84 includes a plurality of isolation portions 840, and the plurality of isolation portions 840 are disposed at intervals along a second direction f2, and the second direction f2 is a direction in which the functional area AB is away from the driving area BB.

As shown in FIG. 10 or FIG. 11, in the second direction f2, the plurality of isolation portions 840 are arranged in sequence with each other spaced apart.

As shown in FIG. 10 or FIG. 11, the plurality of isolation portions 840 disposed at intervals along the second direction f2 may form multi-level barriers against cracks from the cut edge of the silicon substrate 81, thus enhancing the ability of the isolation layer 84 to prevent the cracks from extending.

In specific implementation, the isolation layer 84 may include at least two isolation portions 840. In FIG. 10 and FIG. 11, the isolation layer 84 includes five isolation portions 840.

In some embodiments, as shown in FIG. 10 or FIG. 11, the conducting ring 83 is located between two adjacent isolation portions 840.

In some embodiments, the isolation layer 84 may also be a continuous integrated structure in the second direction f2, which is not limited in the present disclosure.

In some embodiments, as shown in FIG. 10, the conducting ring 83 is a closed circular structure surrounding the drive area BB.

In some embodiments, a thickness of the isolation layer 84 is equal to a thickness of the conducting ring 83, as shown in FIG. 11, the thickness of the isolation layer 84 and the thickness of the conducting ring 83 are both H. In this way, holes of the conducting ring 83 and the isolation layer 84 may be formed synchronously through a single process, while simplifying the process flow, the stability of the isolation layer 84 within the silicon substrate 81 may also be improved.

In some embodiments, the drive circuit 82 may include a conducting layer 85, which is connected to the light emitting device through a via hole VIA. In specific implementation, the via hole VIA connecting the conducting layer 85 and the light emitting device, holes of the conducting ring 83 and the isolation layer 84 may be formed synchronously through a single process, thereby simplifying the process flow.

In the present disclosure. "a plurality of" means two or more, and "at least one" means one or more, unless otherwise specified.

In the present disclosure, orientation or positional relationships indicated by the terms "up". "below", and others are based on the orientation or positional relationships shown in the accompanying drawings, which is only for the convenience of describing and simplifying the description of the present disclosure, and not to indicate or imply that the referred device or component must have a specific orientation, be constructed and operated in the specific orientation, and therefore cannot be understood as a limitation of the present disclosure.

In the specification, the terms "including". "comprising", or any other variation thereof are intended to cover non-exclusive inclusion, such that a process, method, product, or device that includes a series of elements not only includes those elements, but also includes other elements that are not explicitly listed, or also include elements inherent in such a process, method, product, or device. Without further limitations, the elements limited by the statement 'including one . . . ' do not exclude the existence of other identical elements in the process, method, commodity, or device that includes the said elements.

The terms "an embodiment". "some embodiments". "exemplary embodiments". "one or more embodiments". "examples". "one example". "some examples", etc. referred to in the specification are intended to indicate that specific features, structures, materials, or characteristics related to the embodiment or example are included in at least one embodiment or example of the present disclosure. The schematic representation of the above terms may not necessarily refer to the same embodiment or example. In addition, the specific features, structures, materials, or features described may be included in any one or more embodiments or examples in any appropriate manner.

In the specification, relational terms such as first and second are only used to distinguish one entity or operation from another entity or operation, and do not necessarily require or imply any actual relationship or order between these entities or operations.

When describing some embodiments, the expressions "coupled" and "connected" may be used. For example, the term 'connection' may be used when describing some embodiments to indicate direct physical or electrical contact between two or more components. For example, the term "coupled" may be used when describing some embodiments to indicate direct physical or electrical contact between two or more components. However, the term "coupled" or "communicatively coupled" may also refer to two or more components that do not have direct contact with each other but still collaborate or interact with each other. The disclosed embodiments here are not necessarily limited to the content of the specification.

"At least one of A. B. and C" has the same meaning as "at least one of A. B. or C" and includes the following combinations of A. B. and C: only A, only B, only C, a combination of A and B, a combination of A and C, a combination of B and C. and a combination of A. B. and C.

"A and/or B" includes the following three combinations: only A, only B. and a combination of A and B.

As used in the specification, the term "if" is optionally interpreted as meaning "when" or "at" or "in response to determination" or "in response to detection" depending on the context. Similarly, depending on the context, the phrases "if it is determined that . . . " or "if [the stated condition or event] is detected" are optionally interpreted as referring to "when determining . . . " or "in response to determining . . . " or "when detecting [the stated condition or event]" or "in response to detecting [the stated condition or event]".

The use of 'used' or 'configured as' in the specification implies open and inclusive language, which does not exclude devices that are applicable or configured to perform additional tasks or steps.

The use of 'based on' or 'according to' in the specification implies openness and inclusiveness. A process, step, calculation, or other action based on one or more of the conditions or values may be based on other conditions or exceed the values in practice. A process, step, calculation, or other action according to one or more of the conditions or values, which in practice may be according to other conditions or exceed the values.

As used in the specification. "about". "roughly", or "approximately" includes the stated value and the average value within the acceptable deviation range of a specific value, where the acceptable deviation range is determined by ordinary technical personnel in the art taking into account the measurement being discussed and the errors related to a specific amount of measurement (i.e., the limitations of the measurement system).

As used in the specification. 'parallel'. 'vertical'. 'equal', and 'flush' include the described situation and situations that are similar to the described situation, and the range of similar situations is within the acceptable deviation range. The acceptable deviation range is determined by ordinary technical personnel in the art, taking into account the measurement being discussed and the errors related to a specific amount of measurement (i.e., the limitations of the measurement system). For example, 'parallel' includes absolute parallelism and approximate parallelism, where the acceptable deviation range of approximate parallelism can be within 5°; 'vertical' includes absolute vertical and approximately vertical, where the acceptable deviation range of approximately vertical can also be within 5°. 'Equality' includes absolute equality and approximate equality, where the acceptable deviation range of approximate equality, for example, may be that the difference between the equal two is less than or equal to 5% of either. 'Flush' includes absolute flush and approximate flush, where the acceptable deviation range of approximate flush, for example, may be that the distance between the flush two is less than or equal to 5% of the size of either.

It should be understood that when a layer or component is called on another layer or substrate, it can be that the layer or component is directly on another layer or substrate, or there can be an intermediate layer between the layer or component and another layer or substrate.

The specification describes exemplary embodiments with reference to the cross-sectional view and/or the plan view as idealized exemplary drawings. In the attached drawings, the thicknesses of the layers and areas have been enlarged for clarity. Therefore, it can be assumed that changes in shape relative to the drawings may occur due to manufacturing techniques and/or tolerances, for example. Therefore, exemplary embodiments should not be interpreted as limited to the shape of the areas shown herein, but rather include shape deviations caused by, for example, manufacturing. For example, the etched area shown as a rectangle will typically have curved features. Therefore, the areas shown in the accompanying drawings are essentially schematic, and their shapes are not intended to show the actual shape of the area of the device, nor are not intended to limit the scope of exemplary embodiments.

Finally, it should be noted that the above embodiments are only used to illustrate the technical solutions of the present disclosure, not to limit it. Although the present disclosure has been described in detail with reference to the aforementioned embodiments, ordinary technical personnel in the art should understand that they can still modify the technical solutions recorded in the aforementioned embodiments or equivalently replace some of the technical features. And these modifications or replacements do not separate the essence of the corresponding technical solutions from the spirit and scope of the embodiments of the present disclosure.

The invention claimed is:

1. A display panel, comprising an active area and a peripheral area located on at least one side of the active area, wherein the display panel further comprises:

a driving baseplate, comprising a substrate and a conducting ring embedded on a surface of one side of the substrate, wherein the conducting ring is located in the peripheral area;

a light emitting device, located in the active area and disposed on a side of the driving baseplate close to the conducting ring;

an isolation dam, located in the peripheral area and disposed on a side of the conducting ring away from the substrate, wherein the isolation dam overlaps with the conducting ring; and an encapsulation layer, disposed on sides of the light emitting device and the isolation dam away from the substrate, wherein the isolation dam comprises a first isolation layer, and wherein the first isolation layer is a continuous integrated structure in a first direction, and the first direction is a direction in which the peripheral area is away from the active area.

2. The display panel according to claim 1, wherein an orthographic projection of the isolation dam on the substrate covers an orthographic projection of the conducting ring on the substrate.

3. The display panel according to claim 1, wherein an outer edge of an orthographic projection of the isolation dam on the substrate is located on a side of an outer edge of an orthographic projection of the conducting ring on the substrate away from the active area; and an inner edge of the orthographic projection of the isolation dam on the substrate is located on a side of an inner edge of the orthographic projection of the conducting ring on the substrate close to the active area.

4. The display panel according to claim 1, wherein an outer edge of an orthographic projection of the isolation dam on the substrate is retracted by a preset distance relative to an outer edge of the substrate towards a side close to the active area, and the preset distance is greater than 0.

5. The display panel according to claim 4, wherein the preset distance is greater than or equal to 20 microns, and less than or equal to 100 microns.

6. The display panel according to claim 1, wherein in the first direction, a size of the isolation dam is greater than or equal to 0.1 times a size of the peripheral area, and less than or equal to 0.2 times the size of the peripheral area, and the first direction is a direction in which the peripheral area is away from the active area.

7. The display panel according to claim 1, wherein the isolation dam is a closed circular structure surrounding the active area.

8. The display panel according to claim 1, wherein edges of an orthographic projection of the isolation dam on the substrate are provided with at least one first interior angle, and edges of an orthographic projection of the conducting ring on the substrate are provided with at least one second interior angle;

wherein the first interior angle and the second interior angle are both round corners.

9. The display panel according to claim 1, wherein the isolation dam further comprises:

a second isolation layer, located on a side of the first isolation layer close to the substrate, wherein the second isolation layer and the conducting ring are embedded on a same surface of the substrate, and an orthographic projection of the first isolation layer on the substrate covers an orthographic projection of the second isolation layer on the substrate.

10. The display panel according to claim 9, wherein the second isolation layer comprises a plurality of first isolation portions, and the plurality of first isolation portions are disposed at intervals along the first direction.

11. The display panel according to claim 9, wherein an outer edge of the orthographic projection of the first isolation layer on the substrate is roughly flush with an outer edge of the orthographic projection of the second isolation layer on the substrate, and an inner edge of the orthographic projection of the first isolation layer on the substrate is roughly flush with an inner edge of the orthographic projection of the second isolation layer on the substrate.

12. The display panel according to claim 9, wherein a thickness of the second isolation layer is equal to a thickness of the conducting ring.

13. The display panel according to claim 1, wherein the isolation dam further comprises:

a third isolation layer, located on a side of the first isolation layer away from the substrate, an orthographic projection of the first isolation layer on the substrate covers an orthographic projection of the third isolation layer on the substrate.

14. The display panel according to claim 13, wherein the third isolation layer comprises a plurality of second isolation portions, and the plurality of second isolation portions are disposed at intervals along the first direction.

15. The display panel according to claim 13, wherein the orthographic projection of the third isolation layer on the substrate does not overlap with an orthographic projection of a second isolation layer on the substrate when the isolation dam further comprises the second isolation layer, the second isolation layer is located on a side of the first isolation layer close to the substrate, the second isolation layer and the conducting ring are embedded on a same surface of the substrate, and an orthographic projection of the first isolation layer on the substrate covers the orthographic projection of the second isolation layer on the substrate.

16. The display panel according to claim 14, wherein in a direction away from the conducting ring, a size of the second isolation portion gradually decreases along the first direction.

17. The display panel according to claim 1, wherein the light emitting device comprises: a reflecting electrode, a microcavity regulating layer, a first electrode, a luminescent layer and a second electrode that are disposed in stacked, and the reflecting electrode is disposed close to the driving baseplate;

the display panel further comprises: a pixel definition layer, disposed on a side of the driving baseplate close to the conducting ring and provided with a plurality of pixel openings which are used to set the light emitting device; and the isolation dam comprises at least one isolation layer disposed in stacked, and the isolation layer and the microcavity regulating layer or the pixel definition layer are disposed in a same layer and made of same materials.

18. A driving baseplate, applied to the display panel according to claim 1, wherein the driving baseplate comprises a drive area and a functional area located on at least one side of the drive area, the conducting ring is located in the functional area and embedded on a first surface of the substrate, and the driving baseplate further comprises:

a drive circuit, located in the drive area and at least partially embedded inside the substrate, wherein the drive circuit is used to drive the light emitting device to emit light; and an isolation layer, located in the functional area and embedded on the first surface of the substrate.

19. The driving baseplate according to claim 18, wherein the isolation layer comprises a plurality of isolation portions, the plurality of isolation portions are disposed at intervals along a second direction, and the second direction is a direction in which the functional area away from the drive area.

* * * * *